(12) United States Patent
Fong (10) Patent No.: US 7,411,427 B1
(45) Date of Patent: Aug. 12, 2008

(54) CLOCK INPUT FILTER CIRCUIT

(75) Inventor: Steven K. Fong, Saratoga, CA (US)

(73) Assignee: ZiLOG, Inc., San Jose, CA (US)

( * ) Notice: Subject to any disclaimer, the term of this patent is extended or adjusted under 35 U.S.C. 154(b) by 177 days.

(21) Appl. No.: 11/495,477

(22) Filed: Jul. 28, 2006

(51) Int. Cl.
*G01R 29/02* (2006.01)
*H03K 9/08* (2006.01)

(52) U.S. Cl. .................. 327/34; 327/175; 327/291; 327/299

(58) Field of Classification Search .............. 327/175, 327/291, 299
See application file for complete search history.

(56) References Cited

U.S. PATENT DOCUMENTS

| | | | | |
|---|---|---|---|---|
| 3,566,038 A | * | 2/1971 | Slavin | 370/535 |
| 3,585,307 A | * | 6/1971 | Greenberg | 370/244 |
| 3,904,894 A | * | 9/1975 | Ciolli | 327/227 |
| 4,355,283 A | * | 10/1982 | Ott | 327/172 |
| 5,650,739 A | | 7/1997 | Hui et al. | 327/262 |
| 5,841,296 A | | 11/1998 | Churcher et al. | 326/49 |
| 6,507,221 B2 | | 1/2003 | La Rosa | 327/34 |
| 6,535,057 B2 | | 3/2003 | Chakravarthy | 327/551 |
| 2004/0108878 A1 | | 6/2004 | Dosho et al. | 327/175 |
| 2006/0082391 A1 | * | 4/2006 | Hsu et al. | 327/34 |

* cited by examiner

*Primary Examiner*—N. Drew Richards
*Assistant Examiner*—Adam Houston
(74) *Attorney, Agent, or Firm*—Imperium Patent Works; T. Lester Wallace (57) ABSTRACT

A clock input filter uses a first programmable low-pass delay element to filter during a low period of an input clock signal and to output a SET signal. The clock input filter uses a second programmable low-pass delay element to filter during a high period of the input clock signal and to output a RESET signal. A latch is set and reset by the SET and RESET signals. The latch outputs a filtered version of the input signal that has the same approximate duty cycle as the input signal. A pair of gates generates a corresponding pair of duty cycle adjusted versions of the input signal. Output multiplexing circuitry is provided to output either the output of the latch, or an increased duty cycle version of the input signal, or a decreased duty cycle version of the input signal, or an unfiltered version of the input signal.

19 Claims, 7 Drawing Sheets

| A0 | A1 | A2 | S0 | S1 | S2 | S3 | S4 | S5 | S6 | S7 | FILTER OR DELAY |
|---|---|---|---|---|---|---|---|---|---|---|---|
| 0 | 0 | 0 | 1 | 0 | 0 | 0 | 0 | 0 | 0 | 0 | 4 NS |
| 0 | 0 | 1 | 1 | 1 | 0 | 0 | 0 | 0 | 0 | 0 | 7 NS |
| 0 | 1 | 0 | 1 | 1 | 1 | 0 | 0 | 0 | 0 | 0 | 10 NS |
| 0 | 1 | 1 | 1 | 1 | 1 | 1 | 0 | 0 | 0 | 0 | 13 NS |
| 1 | 0 | 0 | 1 | 1 | 1 | 1 | 1 | 0 | 0 | 0 | 16 NS |
| 1 | 0 | 1 | 1 | 1 | 1 | 1 | 1 | 1 | 0 | 0 | 19 NS |
| 1 | 1 | 0 | 1 | 1 | 1 | 1 | 1 | 1 | 1 | 0 | 22 NS |
| 1 | 1 | 1 | 1 | 1 | 1 | 1 | 1 | 1 | 1 | 1 | 25 NS |

FIG. 7

| B1 | B0 | T0 | T1 | T2 | T3 | OUT |
|---|---|---|---|---|---|---|
| 0 | 0 | 0 | 1 | 0 | 0 | OUT=IN, NO FILTER |
| 0 | 1 | 1 | 1 | 0 | 0 | H/L FILTERED AND NO DUTY CYCLE CHANGE |
| 1 | 0 | 1 | 0 | 1 | 0 | H FILTERED, DUTY CYCLE INCREASE |
| 1 | 1 | 1 | 0 | 0 | 1 | L FILTERED, DUTY CYCLE DECREASE |

CLOCK INPUT FILTER CIRCUIT

TECHNICAL FIELD

The described embodiments relate to clock input filters.

BACKGROUND INFORMATION

FIGS. 1-4 (Prior Art) illustrate various examples of prior art clock input filter circuits. The circuit of FIG. 1 (see U.S. Pat. No. 5,650,739 for further details) involves analog circuitry including a pair of comparators. This circuit is fairly large when realized in integrated circuit form, consumes a substantial amount of static power, and involves an external threshold voltage generator. The circuit of FIG. 2 (see U.S. Pat. No. 6,507,221 for further details) involves a pair of delay circuits and digital Schmitt triggers rather than the delay circuits and analog comparators of FIG. 1, but the circuit of FIG. 2 involves an intercoupling between the outputs of the Schmitt triggers and the delay circuit supplying the other Schmitt trigger. The circuit of FIG. 3 (see U.S. Pat. No. 6,535,057 for further details) has only a single programmable delay line that supplies the input signals to the AND and BAND gates. Similarly, the circuit of FIG. 4 (see U.S. Pat. No. 6,535,057 for further details) involves only a single delay circuit DELBUF. None of the circuits of FIGS. 1-4 is readily programmable to adjust the duty cycle of the output signal. A more versatile and processor-configurable clock input filter circuit having low static power consumption and having a duty cycle adjust capability is desired.

SUMMARY

A clock input filter uses a first programmable low-pass delay element to low-pass filter during a low period of an input clock signal and to output a SET signal. The clock input filter uses a second programmable low-pass delay element to low-pass filter during a high period of the input clock signal and to output a RESET signal. A latch is set by the SET signal. The latch is reset by the RESET signal. The latch outputs a filtered version of the input signal that has the same approximate duty cycle as the input signal. A pair of gates generates a corresponding pair of filtered and duty cycle adjusted versions of the input signal. One of the filtered and duty cycle adjusted versions of the input signal has a duty cycle that is greater than the duty cycle of the input signal. The other of the filtered and duty cycle adjusted versions of the input signal has a duty cycle that is smaller than the duty cycle of the input signal. The clock input filter includes output multiplexing circuitry that outputs either the filtered output of the latch, or the filtered and increased duty cycle version of the input signal, or the filtered and decreased duty cycle version of the input signal, or an unfiltered version of the input signal.

In one embodiment, the SET signal is a signal output by a first logic gate. A first input lead of the first logic gate is coupled to receive a buffered or inverted version of the input clock signal. The buffered or inverted version of the input clock signal is referred to as the first signal. The first signal is supplied onto an input lead of the first programmable low-pass delay element such that the first programmable low-pass delay element outputs a filtered and delayed version of the first signal onto the second input lead of the first logic gate. The first programmable low-pass delay element includes a first RC network, the RC time constant of which is controllable by a processor.

Similarly, the RESET signal is a signal output by a second logic gate. A first input lead of the first logic gate is coupled to receive the first signal. The first signal is supplied onto an input lead of the second programmable low-pass delay element such that the second programmable low-pass delay element outputs a filtered and delayed version of the first signal onto the second input lead of the second logic gate. The second programmable low-pass delay element includes a second RC network, the RC time constant of which is controllable by the processor. In one embodiment, the clock input filter performs its filtering and duty cycle adjusting functions without using any analog differential comparators. The clock input filter performs a glitch filtering function in the sense that the signal output from the clock input filter has the same number of clock edges as the input signal would have had had the input signal had no glitches. The first and second programmable low-pass delay elements consume some switching power, but consume substantially no static power. In this embodiment, the duty cycle of the signal output from the clock input filter (in a glitch free condition) varies no more than twenty percent over standard process, temperature and voltage ranges.

Further details and embodiments are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 9 is a simplified waveform diagram that illustrates an operation of low-pass delay element 15 of FIG. 5. The waveforms of FIGS. 6 and 9 and the associated description is simplified. More accurate circuit operation can be observed by simulating the circuit of FIG. 5 using SPICE or another similar circuit simulation program using models appropriate for the particular semiconductor process employed to realize the circuit. Component values and sizes can be adjusted to customize timing and circuit operation for a particular application.

DETAILED DESCRIPTION

Figure 1:
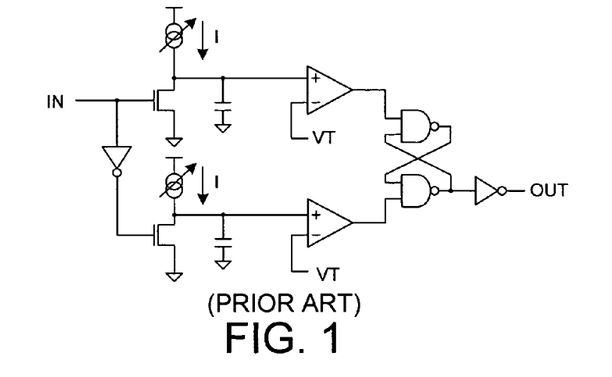
FIGS. 1-4 (Prior Art) are diagrams of various prior art clock filter circuits.
Figure 2:
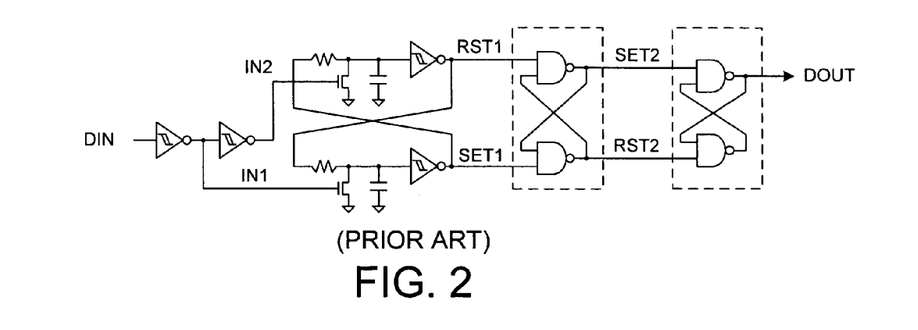
Figure 3:
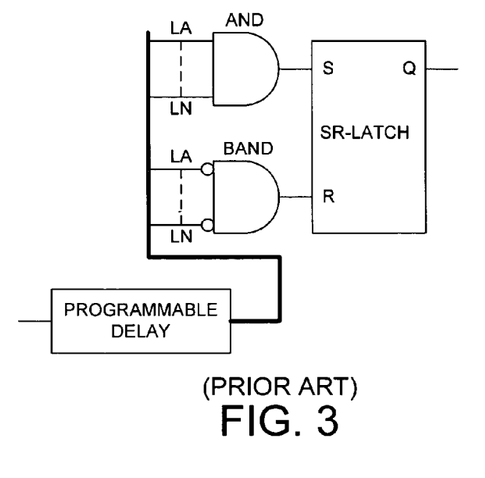
Figure 4:
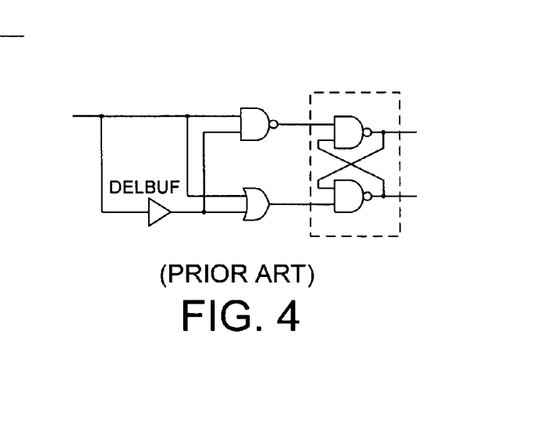
Figure 5:
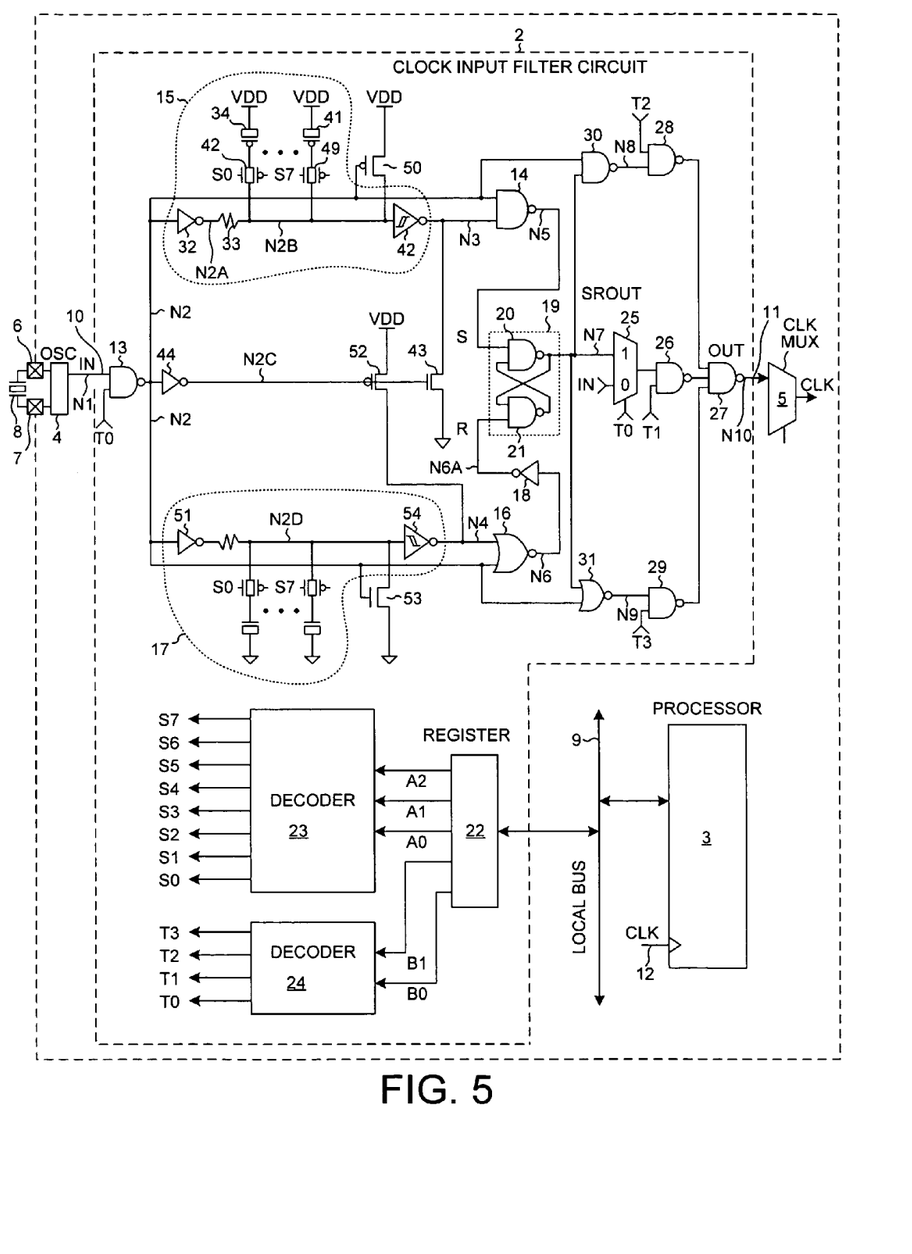
FIG. 5 is a circuit diagram of a novel clock input filter circuit within a microcontroller integrated circuit.

FIG. 5 is a diagram of a microcontroller integrated circuit 1 in accordance with one novel aspect. Microcontroller integrated circuit 1 includes a novel clock input filter circuit 2, a digital processor 3, a crystal oscillator circuit 4, a clock multiplexer circuit 5, and two terminals 6 and 7. Other parts of the microcontroller integrated circuit are not illustrated. An external crystal 8 is coupled to the crystal oscillator circuit 4 via the two terminals 6 and 7. Processor 3 is coupled to and controls the clock input filter circuit 2 via the local bus 9 of the microcontroller. Oscillator circuit 4 outputs a clock signal IN onto the input lead 10 of the clock input filter circuit 2. The clock input filter circuit 2 conditions and filters the signal IN and outputs the resulting signal OUT onto the output lead 11 of the clock input filter circuit 2. The signal OUT is multiplexed through clock multiplexer circuit 5 and is supplied as the signal CLK onto the clock input lead 12 of processor 3. Although not illustrated in FIG. 1, the clock multiplexer circuit 5 can multiplex a selected one of several other clock signals (for example, an output of an internal precision oscillator or an output of a low-power internal watchdog timer oscillator) onto the clock input lead 12 of processor 3. For further information on clock multiplexer circuit 5, see U.S. patent application Ser. No. 10/764,391, entitled "Clock Controller With Clock Source Fail-Safe Logic", filed Jan. 23, 2004, by Richmond et al. (the subject matter of which is incorporated herein by reference).

Figure 6:
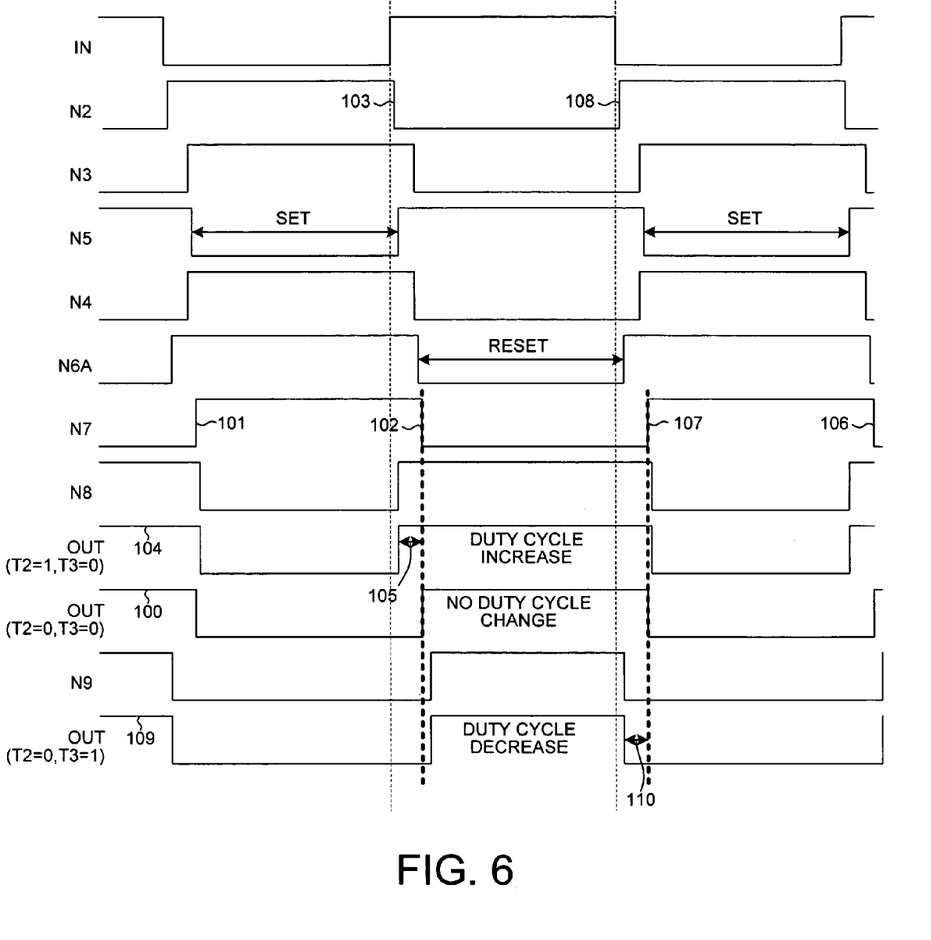
FIG. 6 is a simplified waveform diagram that illustrates how the clock input filter circuit of FIG. 5 filters an input signal IN, generates a filtered version of the input signal that has an increased duty cycle, and that generates a filtered version of the input signal that has a decreased duty cycle.

Operation of clock input filter circuit 2 is described in further detail in connection with the simplified waveform diagram of FIG. 6. For simplicity of illustration, the waveforms are illustrated in idealized fashion having straight edges. The waveform labeled IN represents the signal IN on input lead 10 of clock input filter circuit 2. Input lead 10 is referred to here as node N1. In this example, configuration signal T0 is a digital logic high. NAND gate 13 therefore inverts the signal IN and supplies an inverted version of the signal IN onto node N2. The signal on node N2 is referred to here as the first signal. The waveform labeled N2 in FIG. 6 represents the first signal on node N2. The first signal is supplied directly onto the upper input lead of NAND gate 14. A first low-pass delay element 15 receives the first signal on node N2 and outputs a delayed and filtered version of the first signal onto the lower input lead NAND gate 14. The lower input lead is node N3 in FIG. 5. The waveform labeled N3 in FIG. 6 represents the delayed and filtered version of the first signal on node N3. NAND gate 14 outputs a digital logic low signal if the signals on both its upper and lower input leads are digital logic high levels. The waveform labeled N5 in FIG. 6 represents the signal output by NAND gate 14. The signal on node N5 therefore pulses low during the time labeled as "SET" in the waveform of FIG. 6.

In similar fashion, the first signal on node N2 is supplied directly onto the lower input lead of NOR gate 16. A second low-pass delay element 17 receives the first signal and supplies a delayed and filtered version of the first signal onto the upper input lead of NOR gate 16. The upper input lead of NOR gate 16 is node N4 in FIG. 5. The waveform labeled N4 in FIG. 6 represents the delayed and filtered version of the first signal that is output by second low-pass delay element 17. NOR gate 16 outputs a digital logic high signal if the signals on both its upper and lower input leads are digital logic low levels. The signal output from NOR gate 16 is inverted by inverter 18. The signal on node N6A is therefore a digital logic low if the signals on both input leads of NOR gate 16 are digital logic low levels. NOR gate 16 and inverter 18 may be considered together to be a single OR gate. The signal output by this OR gate onto node N6A is represented by the waveform labeled N6A in FIG. 6. The signal on node N6A pulses low during the time labeled "RESET" in the waveform of FIG. 6.

Node N5 is the active low SET input (level sensitive) of a sequential logic element 19. Node N6A is the active low RESET input (level sensitive) of sequential logic element 19. Sequential logic element 19 in this example is an SR-latch involving a pair of cross-coupled NAND gates 20 and 21. The "S" in FIG. 5 designates the SET input of the latch. The "R" in FIG. 6 designates the RESET input of the latch.

Sequential logic element 19 supplies the signal SROUT onto node N7. The waveform labeled N7 in FIG. 6 represents the signal SROUT. When the latch is in the "set" state then latch asserts SROUT to a digital logic high level, whereas when the latch is in the "reset" state then the latch asserts SROUT to a digital logic low level. From the waveforms of FIG. 6, it is recognized that a low pulse of the "SET" signal on node N5 sets the latch such that the signal SROUT on node N7 is forced high. A low pulse of the "RESET" signal on node N6A resets the latch such that the signal SROUT on node N7 is forced low. The clock input filter circuit 2 of FIG. 5 works in this way, setting and resetting the latch in alternating fashion.

Figure 7:
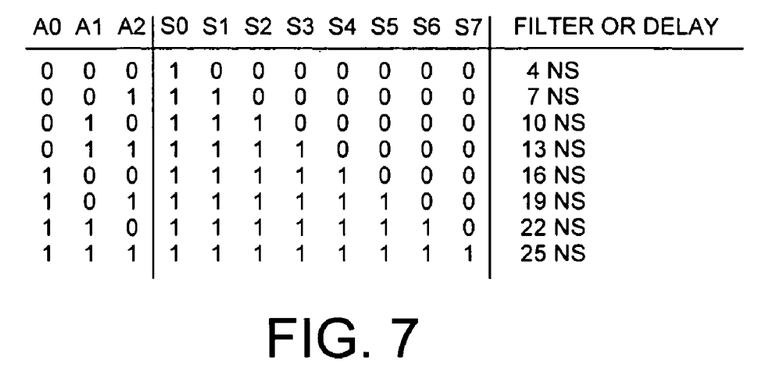
FIGS. 7 and 8 are tables that set forth the decoding performed by the decoders of the circuit of FIG. 5.

Processor 3 can write a five-bit value in parallel into register 22. The bits of this five-bit value are designated A2, A1, A0, B1 and B0. The values of these five bits are decoded by decoders 23 and 24 to generate configuration and control signals S7-S0 and T3-T0. The decoding functions performed by decoders 23 and 24 are set forth in the tables of FIGS. 7 and 8.

Figure 8:
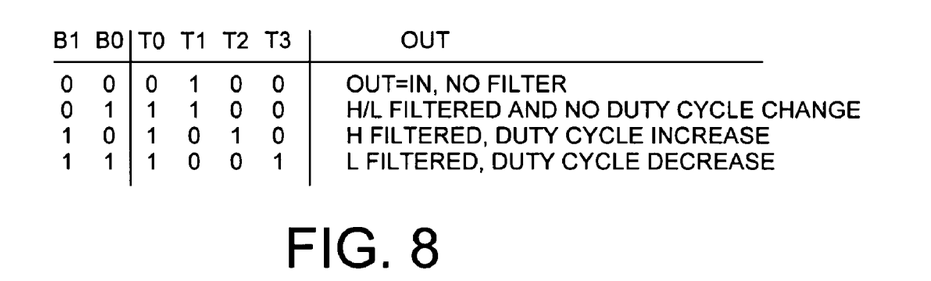

If bit B1 has a digital low value and bit B0 has a digital high value, then the values of T0-T3 are [1, 1, 0, 0] as indicated by the second row of the table of FIG. 8. The SROUT signal on node N7 is communicated from the upper input lead of multiplexer 25 and onto the upper input lead of NAND gate 26. Because signal T1 is a digital logic high, NAND gate 26 inverts the signal output by multiplexer 25 and supplies the resulting signal onto the center input lead of three-input NAND gate 27. Because T2 and T3 both have digital logic low values, NAND gates 28 and 29 output digital logic high signals. Three-input NAND gate 27 therefore serves to invert the signal output by NAND gate 26. The resulting signal is designated signal OUT and is supplied onto node N10. The logic inversions of gates 26 and 27 cancel one another such that the polarity of the signal OUT on node N10 is the same as the polarity of the signal SROUT on node N7. The waveform 100 in FIG. 6 represents this operation wherein the clock input filter circuit 2 receives the input signal IN and outputs the signal OUT such that the input signal IN is filtered (as will be explained in further detail below) and such that the signal OUT has substantially the same duty cycle as the input signal IN. In one example, clock multiplexer 5 supplies the signal OUT as signal CLK onto the CLK input lead 12 of processor 3.

Clock input filter circuit 2 can be configured and controlled by processor 3 to receive the input signal IN and to output the signal OUT such that the input signal IN is filtered and such that the signal OUT has a substantially larger duty cycle that the signal IN. To do this, processor 3 writes a five-bit value into register 22 such that bits B1 and B0 are "1" and "0", respectively. Decoder 24 outputs the values T0-T3 to be [1, 0, 1, 0] as indicated in the third row of the table of FIG. 8. T1 is a digital logic low so NAND gate 26 outputs a constant digital logic high onto the middle input lead of NAND gate 27, thereby blocking the SROUT signal supplied through multiplexer 25. T3 is a digital logic low, thereby causing NAND gate 29 to output a constant digital logic high value onto the lower input lead of NAND gate 27, thereby blocking the signal on node N9 from being supplied in inverted fashion onto the lower input lead of NAND gate 27. T2 is, however, a digital logic high. The signal on node N8 therefore is supplied in inverted fashion onto the upper input lead of NAND gate 27. NAND gate 27, because digital logic high values are present on its middle and lower input lead, inverts the signal on its upper input lead and supplies the resulting signal onto node N10 as the signal OUT.

Multiplexer 25 and gates 28, 26, 29, and 27 together form a four-input multiplexer structure. In this situation where T0=1, T1=0, T2=1 and T3=0, the signal on node N8 is selected to be coupled to the output of the four-input multiplexer structure.

NAND gate 30 outputs a digital logic low level if the signals on both of its input leads have digital logic high levels. The waveform N8 in FIG. 6 illustrates the operation of NAND gate 30. The signals on the two input leads of NAND gate 30 are the signals designated N2 and N7. The signal output by NAND gate 30 is the signal designated N8. Note that the signal on node N8 transitions from high-to-low as a result of the low-to-high transition 101 of non-duty-cycle adjusted signal SROUT on node N7. Note, however, that the signal on node N8 then transitions from low-to-high prior to the low-to-high transition 102 of the non-duty cycle adjusted signal on node N7. The signal on node N8 transitions from low-to-high due to the high-to-low transition 103 of the first signal on node N2. The result is a shortening of the amount of time that the signal on node N8 is low in comparison to the amount of time that the signal IN is low. The signal on node N8 passes through two inversions of gates 28 and 27 and is supplied onto node N10 as the signal OUT. In FIG. 6, the waveform 104 labeled OUT represents the signal OUT when the clock input filter circuit 2 is configured to increase the duty cycle of the signal OUT. What is increased in this example is the amount of time that the signal OUT is at a digital logic level high as compared to the amount of time that the signal IN is at a digital logic level high. The amount of the increase is the propagation delay of a high-to-low transition on node N2 passing to node N7 (through gates 14 and 20). The amount of increase of the high time of the signal OUT is roughly designated with reference numeral 105 in FIG. 6.

Clock input filter circuit 2 can also be configured and controlled by processor 3 to receive the input signal IN and to output the signal OUT such that the signal OUT has a substantially smaller duty cycle that the signal IN. To do this, processor 3 writes a five-bit value into register 22 such that bits B1 and B0 are "1" and "1", respectively. Decoder 24 therefore outputs the values T0-T3 to be [1, 0, 0, 1] as indicated in the fourth row of the table of FIG. 8. T1 is a digital logic low so NAND gate 26 outputs a constant digital logic high onto the middle input lead of NAND gate 27, thereby blocking the SROUT signal supplied through multiplexer 25. T2 is a digital logic low so NAND gate 28 outputs a constant digital logic high value onto the upper input lead of NAND gate 27, thereby blocking the signal on node N8 from being supplied in inverted fashion onto the upper input lead of NAND gate 27. T3 is, however, a digital logic high. The signal on node N9 therefore is supplied in inverted fashion onto the lower input lead of NAND gate 27. NAND gate 27, because digital logic high values are present on its upper and middle input leads, inverts the signal on its lower input lead and supplies the resulting signal onto node N10 as the signal OUT.

NOR gate 31 outputs a digital logic high level if the signals on both of its input leads have digital logic low levels. The waveform labeled N9 in FIG. 6 illustrates the operation of NOR gate 31. The signals on the two input leads of NOR gate 31 are the signals designated N2 and N7. The signal output by NOR gate 31 is the signal designated N9. Note that the signal on node N9 transitions from low-to-high as a result of the high-to-low transition 106 of non-duty-cycle adjusted signal SROUT on node N7. Note, however, that the signal on node N9 transitions from high-to-low prior to the low-to-high transition 107 of the non-duty cycle adjusted signal on node N7. The signal on node N9 transitions from high-to-low due to the low-to-high transition 108 of the first signal on node N2. The result is a lengthening of the amount of time that the signal on node N9 is low in comparison to the amount of time that the signal IN is low. The signal on node N9 passes through two inversions of gates 29 and 27 and is supplied onto node N10 as the signal OUT. In FIG. 6, the waveform 109 labeled OUT represents the signal OUT when the clock input filter circuit 2 is configured to decrease the duty cycle of the signal OUT. What is decreased in this example is the amount of time that the signal OUT is at a digital logic level high as compared to the amount of time that the signal IN is at a digital logic level high. The amount of the decrease is the propagation delay of a low-to-high transition on node N2 passing to node N7 (through gates 16, 18 and 21). The amount of decrease of the high time of the signal OUT is designated with reference numeral 110 in FIG. 6.

Low-pass delay element 15 includes an inverter 32, a resistor 33, eight capacitors 34-41, and a hysteresis logic gate 42. Each of the eight capacitors 34-41 has its own switch (in this example, each switch is a passgate that involves a pair of N-channel and P-channel transistors coupled in parallel). In the specific embodiment of FIG. 5, the gate capacitances of P-channel transistors are utilized to realize capacitors 34-41. If the passgate of a capacitor is controlled to be conductive, then one plate of the capacitor is coupled to node N2B, otherwise the passgate is nonconductive and the plate of the capacitor is not coupled to node N2B. The passgates are identified by reference numerals 42-49. Which of the capacitors is/are coupled to node N2B is determined by the values of control bits A2, A1 and A0 that are output from register 22. The table of FIG. 7 sets forth how the bit values A2, A1 and A0 are decoded by decoder 23 to generate the pass-gate control signals S0-S7. If, for example, passgate control signal S0 is a digital logic high, then the leftmost passgate 42 is conductive and the gate plate of capacitor 34 is coupled through passgate 42 to node N2B. Resistor 33 and the total capacitance of all the capacitors 34-41 that is/are controlled to be coupled to node N2B form a low-pass RC network. The RC time constant of the low-pass RC filter of the low-pass delay element 15 is programmably adjustable by processor 3 by changing the values of the bits A2, A1 and A0.

Low-pass delay element 15 low-pass filters low-to-high transitions of the signal on node N2 (high-to-low transitions of the signal IN), but is not to filter high-to-low transitions of the signal on node N2 (low-to-high transitions of the signal IN). A P-channel pullup transistor 50 has its drain coupled to node N2B and its gate coupled to node N2. When the signal on node N2 transitions from a digital logic high to a digital logic low, P-channel transistor 50 is made conductive thereby discharging the capacitance on node N2B to supply voltage VDD. Similarly, when the signal on node N2 transitions from a digital logic high to a digital logic low, then an inverter 44 drives a digital logic high signal onto node N2C and onto the gate of an N-channel pulldown transistor 43. The drain of N-channel pulldown transistor 43 is coupled to node N3. Transistor 43 is made conductive, such that the voltage of the signal on node N3 is pulled down to a digital logic low level. Accordingly, when the level of the signal on node N2 is low (such as upon a high-to-low transition of the signal on node N2), then the input lead of hysteresis gate 42 is forced to a digital logic high and the output lead of hysteresis gate 42 is forced to a digital logic low. The low-pass delay element 15 therefore does not low-pass filter the high-to-low transitions of the signal on node N2, but rather only low-pass filters low-to-high transitions of the signal on node N2.

Figure 9:
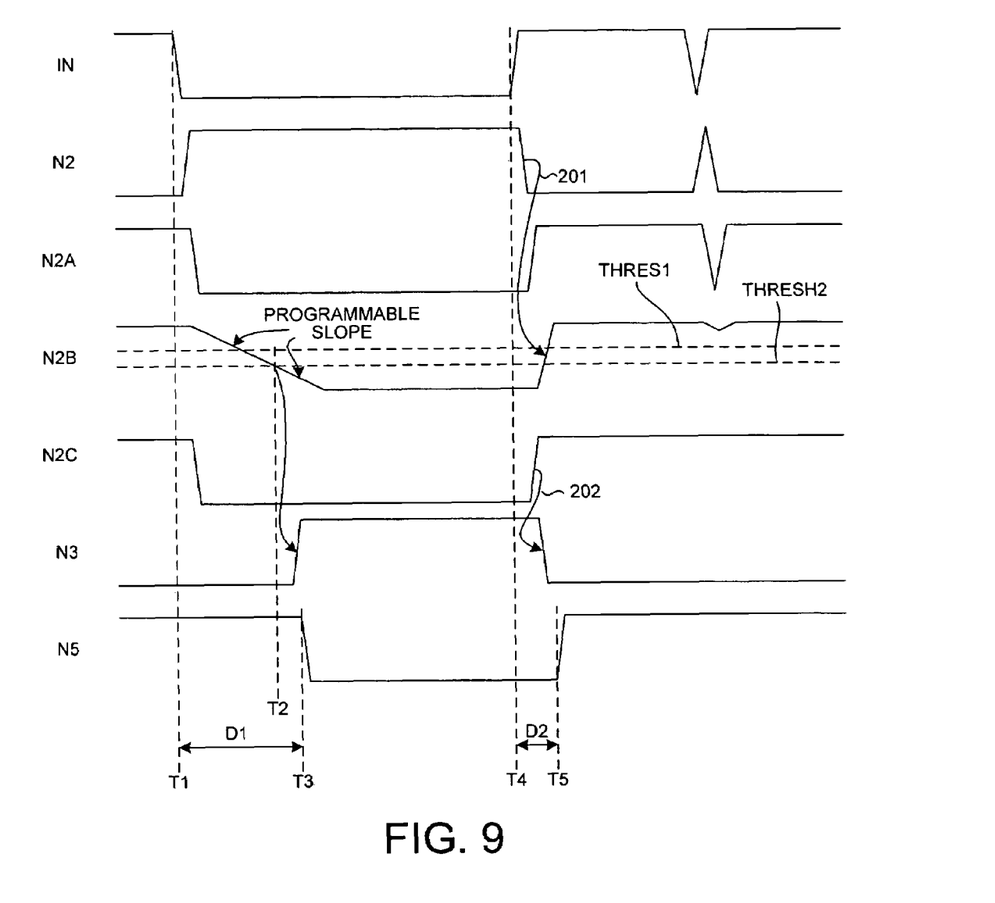

FIG. 9 is a waveform diagram that illustrates an operation of low-pass delay element 15. Signal IN begins transitioning from high to low at time T1 and then transitions from low to high at time T4. NAND gate 13, operating as an inverter, inverts the signal IN on node N1 and supplies the first signal onto node N2. Inverter 32 of the low-pass delay element 15 in turn inverts the first signal on node N2 and outputs an inverted version of the first signal onto node N2A. The waveform labeled N2A in FIG. 9 illustrates the signal on node N2A. Node N2B is the output node of the RC filter made up of resistor 33 and the capacitances 34-41. The voltage on node N2B decreases relatively slowly in accordance with how fast inverter 32 can charge the capacitance on node N2B. The waveform labeled N2B in FIG. 9 illustrates the voltage on node N2B decreasing slowly after the falling edge of the signal on node N2A. The slope of the voltage on node N2B can be adjusted and changed by processor 3. Although waveform N2B is illustrated as decreasing linearly, the actual signal decreases in a substantially exponential manner characteristic of an RC network. When the voltage on node N2B decreases to the point that it reaches the high-to-low threshold THRESH2 of hysteresis logic gate 42, then gate 42 switches and asserts the voltage signal on node N3 to a digital logic high. At the time that the voltage on node N3 transitions high, the signals on both input leads of NAND gate 14 are digital logic high values. NAND gate 14 therefore forces the signal on node N5 to a digital logic low at time T3. The total delay from the beginning of the high-to-low transition of the signal IN at time T1 to the corresponding high-to-low transition of the signal on node N5 at time T3 is designated D1 in FIG. 9.

Next, in the example of FIG. 9 the signal IN transitions from a digital logic low level to a digital logic high level beginning at time T4. Inverter 32 switches such that the signal on node N2A transitions from low to high. The digital logic low value of the signal on node N2 causes P-channel pullup transistor 50 to be made conductive, thereby rapidly pulling the voltage on node N2B up to the supply voltage VDD potential. This action of pulling the voltage on node N2B up to VDD is represented in FIG. 9 by arrow 201. The digital logic low value of the signal on node N2 also causes inverter 44 to make the N-channel pulldown transistor 43 conductive, thereby rapidly pulling the voltage on node N3 down to ground potential. This pulling down of the voltage on node N3 is represented in FIG. 9 by arrow 202. The delay D2 between times T4 and T5 is therefore shorter than the delay D1. Due to the operation of transistors 50 and 43, the RC network within low-pass delay element 15 does not operate to delay a low-to-high transition of the signal. IN.

Low-pass delay element 17 functions in the same manner as low-pass delay element 15, except that low-pass delay element 17 operates in a complementary fashion. The rate at which inverter 51 can charge node N2D up to the low-to-high switching voltage of hysteresis gate 54 is determined by an RC network. High-to-low transitions of the signal IN are not delayed by low-pass delay element 17 due to P-channel pullup transistor 52 and N-channel transistor 53 being made conductive when the signal IN transitions from high to low.

Figure 10:
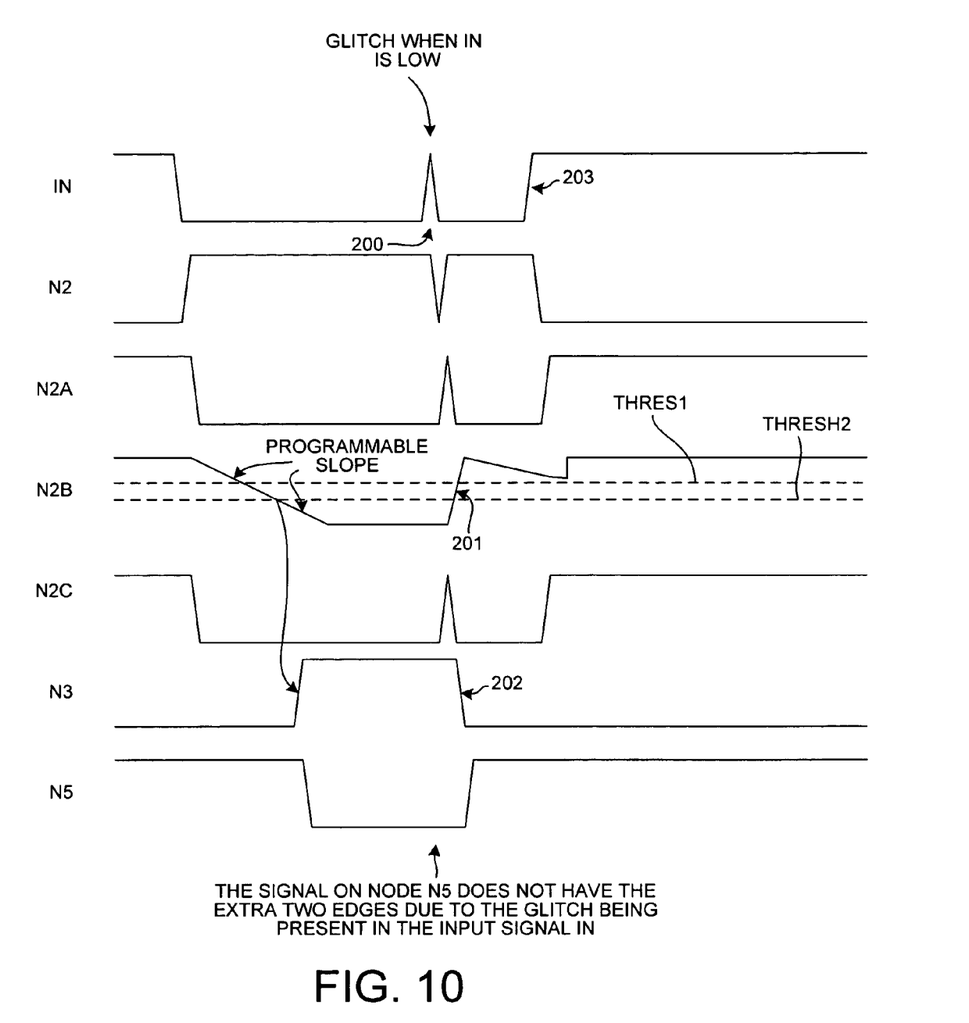
FIG. 10 is a simplified waveform diagram that illustrates how low-pass delay element 15 performs a glitch filtering function.

FIG. 10 is a simplified waveform diagram showing a glitch filtering function performed by low-pass delay element 15. A glitch 200 occurs in the signal IN during the time the signal IN is at a digital logic low level. When the voltage on node N2 decreases to the threshold of transistor 50, transistor 50 is made conductive such that the voltage on node N2B is pulled to a digital logic high level (the capacitance on node N2B is discharged rapidly by transistor 50). The rapidly rising edge 201 is illustrated in the waveform N2B in FIG. 10. Similarly, when glitch 200 causes the voltage on node N2C to increase to the threshold voltage of transistor 43, transistor 43 is made conductive and the voltage on node N3 is pulled to a digital logic low level. This is illustrated as edge 202 in FIG. 10. When glitch 200 passes and the voltage on node N2 returns high, the transistors 50 and 43 are again made non-conductive. At this time, inverter 32 again outputs a digital logic low level onto node N2A as illustrated in FIG. 10. The voltage on node N2B therefore slowly falls due to the operation of the RC network in low-pass delay element 15. If the capacitance on node N2B is set to have an appropriate magnitude, then the next rising edge 203 of the input signal IN will occur before the voltage on node N2B reaches the high-to-low threshold voltage THRESH2 of hysteresis gate 42. Hysteresis gate 42 will not switch. The output signal on node N5 therefore has two edges rather than the four edges of the input signal IN. The extra two edges in the input signal IN due to the glitch do not pass through the low-pass delay element 15 to node N5. Glitch 200 does not cause an extra low pulse on node N5. Glitch 200 only causes the low SET pulse on node N5 to terminate sooner than it would if there were no glitch. The low SET pulse begins at the same time it would have begun had there been no glitch. Glitch 200 does not affect the output of latch 19, and does not affect the duty cycle or frequency of the output signal OUT on node N10.

Figure 11:
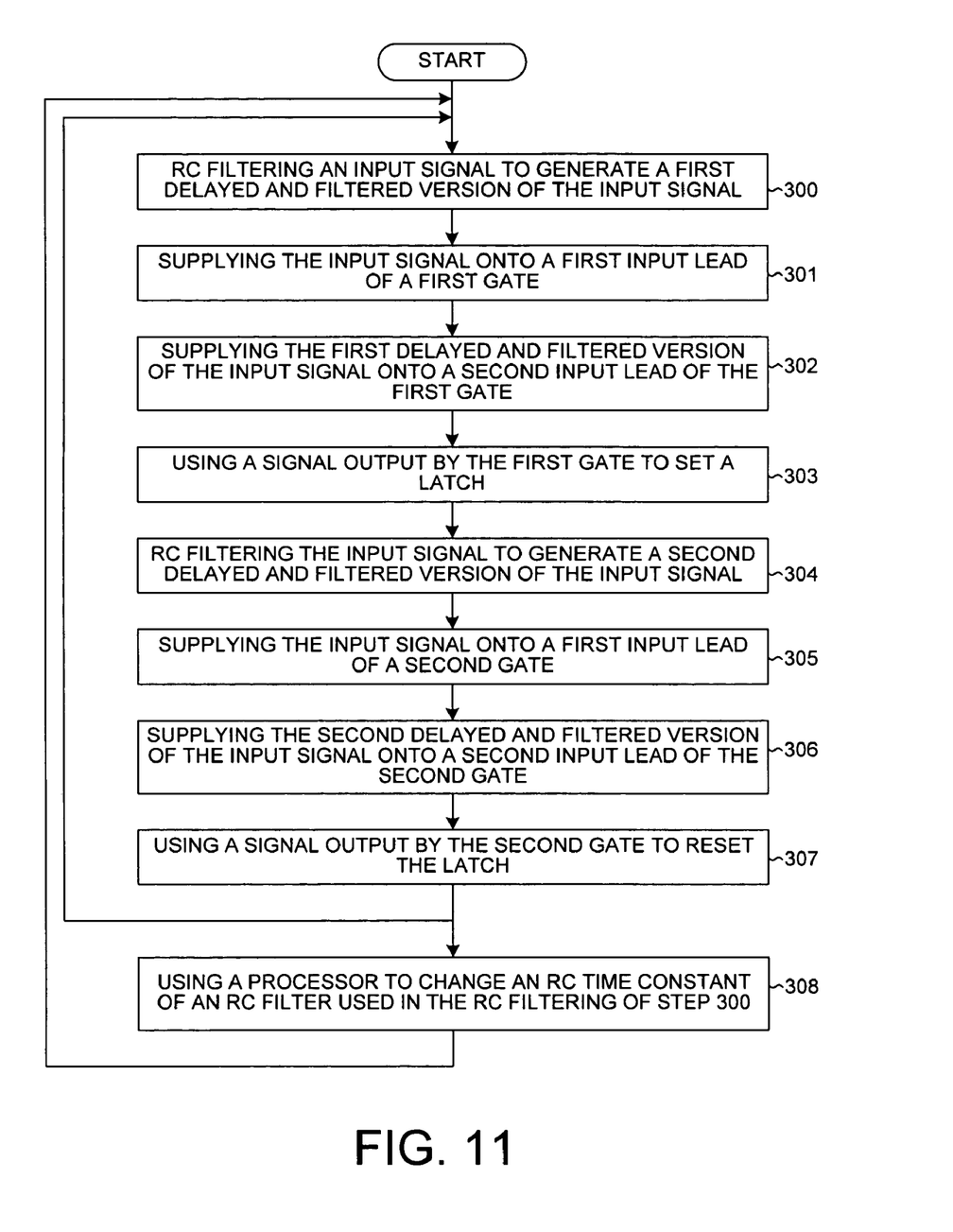
FIG. 11 is a flowchart of a method in accordance with one novel method.

FIG. 11 is a simplified flowchart of a method in accordance with one novel aspect. In one example, the first gate of steps 301-303 is gate 14 of FIG. 5, the latch of steps 303 and 307 is latch 19 of FIG. 5, the second gate of steps 305-307 is gate 16 and inverter 18 of FIG. 5, and the processor of step 308 is processor 3 of FIG. 5. The feedback arrows of the flowchart of FIG. 10 are merely illustrative of two possible times that the processor can change the RC time constant. Processor 3 of FIG. 5 can change the RC time constant of the RC network of low-pass delay element 15 at any time by writing an appropriate value into register 22.

Although certain specific embodiments are described above for instructional purposes, the teachings of this patent document have general applicability and are not limited to the specific embodiments described above. One or both of the transistors 43 and 50 can be omitted from low-pass delay element 15 in some embodiments in order to modify the glitch filtering function performed by low-pass delay element 15. One or both of the transistors 53 and 52 can be omitted from low-pass delay element 17 in order to modify the glitch filtering function performed by low-pass delay element 17. Accordingly, various modifications, adaptations, and combinations of various features of the described embodiments can be practiced without departing from the scope of the invention as set forth in the claims.

What is claimed is:

1. A circuit comprising:
   a first low-pass delay element that receives a first signal and outputs a first delayed version of the first signal;
   a first logic gate that receives the first signal and the first delayed version of the first signal;
   a second low-pass delay element that receives the first signal and outputs a second delayed version of the first signal;
   a second logic gate that receives the first signal and the second delayed version of the first signal;
   a sequential logic element that is set in response to a signal output by the first logic gate, and that is reset in response to a signal output by the second logic gate;
   a third logic gate that has a first input lead and a second input lead, the first signal being present on the first input lead, the second input lead being coupled to receive a signal output by the sequential logic element;
   a fourth logic gate that has a first input lead and a second input lead, the first signal lead being present on the first input lead, the second input lead being coupled to receive the signal output by the sequential logic element; and multiplexing circuitry that has a first input lead, a second input lead, a third input lead, and an output lead, wherein the first input lead is coupled to receive a signal output by the third logic gate, wherein the second input lead is coupled to receive the signal output by the sequential logic element, and wherein the third input lead is coupled to receive a signal output by the fourth logic gate.

2. The circuit of claim 1, wherein the first low-pass delay element has a programmable delay.

3. The circuit of claim 1, wherein the first logic gate has a first input lead and a second input lead, wherein the first signal is present on the first input lead, and wherein the first delayed version of the first signal is present on the second input lead, the circuit further comprising:
a transistor having a source, a drain and a gate, wherein the drain is coupled to the second input lead, wherein the source is coupled to a ground conductor, and wherein the gate is coupled to receive an inverted version of the first signal.

4. The circuit of claim 1, wherein the second logic gate is an OR gate, the OR gate comprising a NOR gate and an inverter.

5. The circuit of claim 1, wherein the first low-pass delay element comprises:
a logic element having an output lead;
a resistor having a first lead and a second lead, wherein the first lead of the resistor is coupled to the output lead of the logic element, and wherein the second lead is coupled to a node;
a plurality of capacitances, wherein each of the capacitances can be selectively coupled to the node; and
a hysteresis logic gate having an input lead, the input lead of the hysteresis logic gate being coupled to the node.

6. The circuit of claim 1, further comprising:
a transistor having a source, a drain and a gate, wherein the drain is coupled to the input lead of the hysteresis logic gate, and wherein the source is coupled to a supply voltage conductor, and wherein the gate is coupled to receive the first signal.

7. The circuit of claim 1, wherein the first low-pass delay element does not include a current source.

8. The circuit of claim 1, wherein the first low-pass delay element does not include a differential comparator.

9. The circuit of claim 1, wherein the circuit is part of an integrated circuit that includes a processor, and wherein the circuit can be configured by the processor to output a version of the first signal that has an increased duty cycle or to output a version of the first signal that has a decreased duty cycle.

10. An integrated circuit comprising:
a processor;
a first gate having a first input lead, a second input lead, and an output lead;
a first logic element having an input lead and an output lead, the input lead of the first logic element being coupled to the first input lead of the first gate;
a first RC network having an input lead and an output lead, wherein the first RC network has a first processor-programmable RC time constant, and wherein the input lead of the first RC network is coupled to the output lead of the first logic element;
a first hysteresis logic element having an input lead and an output lead, wherein the input lead of the first hysteresis logic element is coupled to the output lead of the first RC network, and wherein the output lead of the first hysteresis logic element is coupled to the second input lead of the first gate;
a first transistor having a drain, a source and a gate, wherein the drain is coupled to the input lead of the hysteresis logic element, wherein the source is coupled to a supply voltage conductor, and wherein the gate is coupled to the first input lead of the first gate;
a latch having a first input lead, a second input lead, and an output lead, wherein the first input lead of the latch is coupled to receive a signal output from the first gate;
a second gate having a first input lead, a second input lead, and an output lead, wherein the first input lead of the second gate is coupled to the first input lead of the first gate, wherein the output lead of the second gate is coupled to supply a signal output by the second gate onto the second input lead of the latch;
a second logic element having an input lead and an output lead, the input lead of the second logic element being coupled to the first input lead of the second gate;
a second RC network having an input lead and an output lead, wherein the second RC network has a second processor-programmable RC time constant, and wherein the input lead of the second RC network is coupled to the output lead of the second logic element;
a second hysteresis logic element having an input lead and an output lead, wherein the input lead of the second hysteresis logic element is coupled to the output lead of the second RC network, and wherein the output lead of the second hysteresis logic element is coupled to the second input lead of the second gate; and
a second transistor having a drain, a source and a gate, wherein the drain is coupled to the input lead of the second hysteresis logic element, wherein the source is coupled to a ground conductor, and wherein the gate is coupled to the first input lead of the second gate.

11. The integrated circuit of claim 10, further comprising:
a third logic element having an input lead and an output lead, wherein the input lead of the third logic element is coupled to the first input lead of the first gate;
a third transistor having a drain, a source and a gate, wherein the drain of the third transistor is coupled to the second input lead of the first gate, wherein the source of the third transistor is coupled to a ground conductor, and wherein the gate of the third transistor is coupled to the output lead of the third logic element; and
a fourth transistor having a drain, a source and a gate, wherein the drain of the fourth transistor is coupled to the second input lead of the second gate, wherein the source of the fourth transistor is coupled to a supply voltage conductor, and wherein the gate of the fourth transistor is coupled to the output lead of the third logic element.

12. The integrated circuit of claim 10, further comprising:
a third gate having a first input lead, a second input lead, and an output lead, wherein the first input lead of the third gate is coupled to the first input lead of the first gate, and wherein the second input lead of the third gate is coupled to the output lead of the latch;
a fourth gate having a first input lead, a second input lead, and an output lead, wherein the first input lead of the fourth gate is coupled to the first input lead of the second gate, and wherein the second input lead of the fourth gate is coupled to the output lead of the latch; and
multiplexer circuitry that is processor-controllable to couple a selectable one of a signal output by the latch, a signal output by the third gate, or a signal output by the fourth gate onto a multiplexer output lead.

13. A method comprising:
(a) RC filtering an input signal to generate a first delayed and filtered version of the input signal;
(b) supplying the input signal onto a first input lead of a first gate;
(c) supplying the first delayed and filtered version of the input signal onto a second input lead of the first gate;
(d) using a signal output by the first gate to set a latch;
(e) RC filtering the input signal to generate a second delayed and filtered version of the input signal;
(f) supplying the input signal onto a first input lead of a second gate;
(g) supplying the second delayed and filtered version of the input signal onto a second input lead of the second gate;
(h) using a signal output by the second gate to reset the latch;
(i) using a processor to change an RC time constant of an RC filter used in said RC filtering of step (a); and
(j) using a transistor to couple an output node of said RC filter to a DC voltage conductor when the input signal is at a first digital logic level, and causing the transistor to be nonconductive when the input signal is at a second digital logic level.

14. A method comprising:
(a) RC filtering an input signal to generate a first delayed and filtered version of the input signal;
(b) supplying the input signal onto a first input lead of a first gate;
(c) supplying the first delayed and filtered version of the input signal onto a second input lead of the first gate;
(d) using a signal output by the first gate to set a latch;
(e) RC filtering the input signal to generate a second delayed and filtered version of the input signal;
(f) supplying the input signal onto a first input lead of a second gate;
(g) supplying the second delayed and filtered version of the input signal onto a second input lead of the second gate;
(h) using a signal output by the second gate to reset the latch;
(i) using a processor to change an RC time constant of an RC filter used in said RC filtering of step (a); and
(j) using a transistor to couple the second input lead of the first gate to a DC voltage conductor when the input signal is at a first digital logic level, and causing the transistor to be nonconductive when the input signal is at a second digital logic level.

15. A method comprising:
(a) RC filtering an input signal to generate a first delayed and filtered version of the input signal;
(b) supplying the input signal onto a first input lead of a first gate;
(c) supplying the first delayed and filtered version of the input signal onto a second input lead of the first gate;
(d) using a signal output by the first gate to set a latch;
(e) RC filtering the input signal to generate a second delayed and filtered version of the input signal;
(f) supplying the input signal onto a first input lead of a second gate;
(g) supplying the second delayed and filtered version of the input signal onto a second input lead of the second gate;
(h) using a signal output by the second gate to reset the latch;
(i) using a processor to change an RC time constant of an RC filter used in said RC filtering of step (a); and
(j) generating a duty cycle adjusted version of the input signal by supplying the input signal onto a first input lead of a third gate, and by supplying a signal output by the latch onto a second input lead of the third gate, wherein the third gate outputs the duty cycle adjusted version of the input signal onto an output lead of the third gate.

16. The method of claim 15, further comprising:
(k) generating a second duty cycle adjusted version of the input signal by supplying the input signal onto a first input lead of a fourth gate, and by supplying a signal output by the latch onto a second input lead of the fourth gate, wherein the fourth gate outputs the second duty cycle adjusted version of the input signal onto an output lead of the fourth gate.

17. A circuit comprising: first means for RC filtering a high-to-low transition of an input signal, the first means generating an active low set signal during a time when the input signal has a digital logic low level;
second means for RC filtering a low-to-high transition of the input signal, the second means generating an active low reset signal during a time when the input signal has a digital logic high level;
a latch that is set by the active low set signal and that is reset by the active low reset signal;
a means for generating a first duty cycle adjusted version of the input signal, wherein the first duty cycle adjusted version of the input signal has a duty cycle that is greater than a duty cycle of the input signal;
means for generating a second duty cycle adjusted version of the input signal, wherein the second duty cycle adjusted version of the input signal has a duty cycle that is smaller than the duty cycle of the input signal; and
multiplexer circuitry that is controllable to couple a selectable one of a signal output by the latch, the first duty cycle adjusted version of the input signal, and the second duty cycle adjusted version of the input signal onto an output lead of the multiplexer circuitry.

18. The circuit of claim 17, wherein if a glitch occurs in the input signal during a low pulse of the input signal then the means for RC filtering a high-to-low transition outputs a corresponding single low pulse of the active low set signal, wherein the glitch does not affect a timing of a high-to-low transition that starts the corresponding single low pulse, and wherein a low-to-high transition that terminates the corresponding single low pulse occurs in response to the glitch.

19. The circuit of claim 17, wherein the latch outputs a signal having a duty cycle, and wherein an occurrence of a glitch in the input signal does not affect the duty cycle.

* * * * *